(12) United States Patent
Teshima

(10) Patent No.: US 6,946,730 B2
(45) Date of Patent: Sep. 20, 2005

(54) SEMICONDUCTOR DEVICE HAVING HEAT CONDUCTING PLATE

(75) Inventor: Takanori Teshima, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/787,164

(22) Filed: Feb. 27, 2004

(65) Prior Publication Data

US 2005/0073043 A1 Apr. 7, 2005

Related U.S. Application Data

(63) Continuation of application No. 10/127,613, filed on Apr. 23, 2002.

(30) Foreign Application Priority Data

Apr. 25, 2001 (JP) ......................................... 2001-127516

(51) Int. Cl.[7] .......................... H01L 23/48; H01L 23/36; H01L 25/07; H01L 25/18
(52) U.S. Cl. ........................ 257/718; 257/712; 257/713; 257/777; 257/675; 257/723; 257/685; 257/686; 257/688; 257/707; 257/717; 257/720; 257/796; 257/684; 257/790; 257/788; 257/791; 257/792; 257/795
(58) Field of Search ................................ 257/718, 712, 257/713, 675, 777, 723, 684–686, 707, 720, 717, 787, 790, 788, 791, 792, 795, 796, 688

(56) References Cited

U.S. PATENT DOCUMENTS

| | | |
|---|---|---|
| 3,648,121 A | 3/1972 | Suenaga et al. |
| 3,818,584 A | 6/1974 | Suenaga et al. |
| 4,141,030 A | 2/1979 | Eisele et al. |
| 4,538,170 A | 8/1985 | Yerman |
| 4,546,374 A | 10/1985 | Olsen et al. |
| 4,558,345 A | 12/1985 | Dwyer et al. |
| 4,646,129 A | 2/1987 | Yerman |
| 4,685,987 A * | 8/1987 | Fick ........................... 156/247 |
| 4,827,082 A | 5/1989 | Horiuchi et al. |
| 4,984,061 A | 1/1991 | Matsumoto |
| 5,229,646 A | 7/1993 | Tsumura |
| 5,248,853 A | 9/1993 | Ishikawa et al. |
| 5,311,060 A * | 5/1994 | Rostoker et al. ............ 257/796 |
| 5,481,137 A | 1/1996 | Harada et al. |
| 5,641,997 A | 6/1997 | Ohta et al. |
| 5,708,299 A | 1/1998 | Teramae et al. |
| 5,789,820 A | 8/1998 | Yamashita |

(Continued)

FOREIGN PATENT DOCUMENTS

| | | |
|---|---|---|
| GB | 2146174 | 4/1985 |
| JP | A-54-40569 | 3/1979 |

(Continued)

OTHER PUBLICATIONS

U.S. Appl. No. 09/489,475, filed Jan. 21, 2000, Kimura et al.
U.S. Appl. No. 09/675,209, filed Sep. 29, 2000, Suzuki et al.

(Continued)

*Primary Examiner*—Alexander Oscar Williams
(74) *Attorney, Agent, or Firm*—Posz Law Group, PLC

(57) ABSTRACT

A semiconductor device includes a semiconductor chip generating heat, a pair of heat sinks, which face each other, to conduct heat from both surfaces of the chip, a pair of compressible insulating sheets, and a mold resin covering the chip, the heat sinks, and the sheets such that the sheets are exposed from the surface of the resin. The mold resin is prevented from covering the outer surfaces of the heat sinks, which are pressed by mold parts, and breakage of the chip is avoided during molding. The plates are insulated by the sheets, so no dedicated insulating sheets for the heat sinks are needed after the device is completed.

7 Claims, 3 Drawing Sheets

U.S. PATENT DOCUMENTS

| | | | |
|---|---|---|---|
| 5,801,445 A | | 9/1998 | Ishihara et al. |
| 5,886,400 A | * | 3/1999 | Letterman et al. ........... 257/675 |
| 6,072,240 A | * | 6/2000 | Kimura et al. ............... 257/735 |
| 6,542,365 B2 | | 4/2003 | Inoue |
| 6,627,997 B1 | * | 9/2003 | Eguchi et al. ............... 257/777 |
| 2003/0071348 A1 | * | 4/2003 | Eguchi et al. ............... 257/723 |
| 2003/0106924 A1 | * | 6/2003 | Nobori et al. .......... 228/180.22 |
| 2003/0132530 A1 | * | 7/2003 | Teshima et al. ............. 257/780 |

FOREIGN PATENT DOCUMENTS

| | | | |
|---|---|---|---|
| JP | A-54-95183 | | 7/1979 |
| JP | A-S58-34951 | | 3/1983 |
| JP | 58-34951 | * | 3/1983 |
| JP | A-59-31042 | | 2/1984 |
| JP | B2-59-38734 | | 9/1984 |
| JP | A-60-95947 | | 5/1985 |
| JP | A-60-137042 | | 7/1985 |
| JP | A-60-235430 | | 11/1985 |
| JP | A-61-166051 | | 7/1986 |
| JP | A-61-251043 | | 11/1986 |
| JP | A-61-265849 | | 11/1986 |
| JP | A-S62-2558 | | 1/1987 |
| JP | A-62-92349 | | 4/1987 |
| JP | A-62-141751 | | 6/1987 |
| JP | A-62-287649 | | 12/1987 |
| JP | A-63-96946 | | 4/1988 |
| JP | A-63-102326 | | 5/1988 |
| JP | A-1-228138 | | 9/1989 |
| JP | A-2-117157 | | 5/1990 |
| JP | A-3-20067 | | 1/1991 |
| JP | A-4-12555 | | 1/1992 |
| JP | A-4-27145 | | 1/1992 |
| JP | A-4-103150 | | 4/1992 |
| JP | A-4-249353 | | 9/1992 |
| JP | A-5-109919 | | 4/1993 |
| JP | A-H05-267491 | | 10/1993 |
| JP | A-5-283562 | | 10/1993 |
| JP | A-6-291223 | | 10/1994 |
| JP | A-6-349987 | | 12/1994 |
| JP | A-7-38013 | | 2/1995 |
| JP | A-7-45765 | | 2/1995 |
| JP | A-7-240432 | | 9/1995 |
| JP | A-7-273276 | | 10/1995 |
| JP | A-8-45874 | | 2/1996 |
| JP | A-8-191145 | | 7/1996 |
| JP | A-9-148492 | | 6/1997 |
| JP | A-11-186469 | | 7/1999 |
| JP | A-11-260979 | | 9/1999 |
| JP | A-2000-31351 | | 1/2000 |
| JP | A-2000-91485 | | 3/2000 |
| JP | 2000-174180 | * | 6/2000 |
| JP | A-2000-174180 | | 6/2000 |
| JP | A-2000-294699 | | 10/2000 |
| JP | A-2001-118961 | | 4/2001 |

OTHER PUBLICATIONS

U.S. Appl. No. 09/351,458, filed Jul. 12, 1999, Nakase.
U.S. Appl. No. 09/435,840, filed Nov. 8, 1999, Hirai.
U.S. Appl. No. 09/717,227, filed Nov. 22, 2000, Mamitsu et al.
Nobuhiro Takamura, *Electronic Technology,* May 1999, pp. 56–59.
Johnson and Pote, "Silicon Precipitate Nodule–Induced Failures of MOSFETs," *ISTFA '91: The 17th International Symposium for Testing & Failure Analysis,* Los Angeles, CA, Nov. 11–15, 1991, pp. 161–165.

\* cited by examiner

SEMICONDUCTOR DEVICE HAVING HEAT CONDUCTING PLATE

CROSS REFERENCE TO RELATED APPLICATION

This application is a continuation application of U.S. patent application Ser. No. 10/127,613, which was filed on Apr. 23, 2002, and this application is based on and incorporates herein by reference Japanese Patent Application No. 2000-127516, which was filed on Apr. 25, 2001.

BACKGROUND OF THE INVENTION

The present invention relates to a semiconductor device in which a semiconductor chip generating heat is located between a pair of heat sinks and to a method for manufacturing the device.

A semiconductor chip such as a power IC, which controls a large amount of electric power and current, generates so much heat that a semiconductor device using the chip requires a heat sink to dissipate heat. As shown in FIG. 4, in a proposed semiconductor device 1, a semiconductor chip 4 and a heat sink coupler 5 are located between a pair of heat sinks 2, 3. One heat sink 2 and the chip 4 are soldered together, the chip 4 and the coupler 5 are soldered together, and the coupler 5 and the other heat sink 3 are soldered together. A mold resin 7 covers the chip 4, the heat sink coupler 5, and the heat sinks 2, 3 such that the heat sinks 2, 3 are exposed from the surface of the resin 7. Because the resin 7 covers neither of the outer surfaces of the heat sinks 2, 3, heat is efficiently transferred from the heat sinks 2, 3 from both sides of the chip 4.

The semiconductor device 1 is molded in a mold 8 that includes a lower mold 8a, an upper mold 8b, and a movable mold 8c, as shown FIG. 4. The movable mold 8c presses the device 1 during the molding to prevent the resin 7 from covering the outer surfaces of the heat sinks 2, 3 while adjusting the pressure applied to the device 1 during molding. Therefore, the structure of the mold 8 is relatively complicated and the production cost of the mold 8 is relatively high. Thus, the production cost of the semiconductor device 1 is relatively high. Although the pressure applied to the device 1 is controlled, the semiconductor chip 4 tends to break during the molding because there is nothing to limit the force the chip 4 receives from the mold 8.

In addition, the outer surfaces of the heat sinks 2, 3 need to be insulated when the completed device 1 is inspected, screened, or assembled into a unit such as an inverter unit. For example, as shown in FIG. 5, when the device 1 is located between a pair of cooling plates 9, two heat conducting sheets 10 made of insulating material are inserted between the plates 9 and the outer surfaces of the heat sinks 2, 3.

Moreover, a coating resin such as polyamide resin is applied to the surface of the heat sinks 2, 3 prior to the molding to create a desired adhesion between the heat sinks 2, 3 and the mold resin 7. However, in the semiconductor device 1, the distance between the heat sinks 2, 3 is in the range between 1 and 2 mm, so it is difficult to apply the coating resin on the inner surfaces of the heat sinks 2, 3. It is also difficult to inspect the coating quality.

SUMMARY OF THE INVENTION

The present invention has been made in view of the above problems with an object to provide a semiconductor device that makes it possible to use a mold having a simple structure without damaging a semiconductor chip during molding, makes it unnecessary to insulate both outer surfaces of the heat sinks using dedicated insulating sheets after the device is completed, and makes it easier to apply coating resin on a pair of heat sinks in the manufacturing process of the device.

Insulating sheets, which are made of compressively deformable material, are adhered to the outer surfaces of the heat sinks, and the device is molded in a mold while the sheets are located between the mold and the heat sinks. The sheets are compressively deformed during the molding to prevent the chip from being broken, even if an economical mold having a simple structure is used. The plates are insulated by the sheets to make dedicated insulating sheets unnecessary when the completed device is inspected, screened, or assembled into a unit such as an inverter unit. The coating resin is coated by immersing the chip and the heat sinks in a solution containing the resin to simplify the coating.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
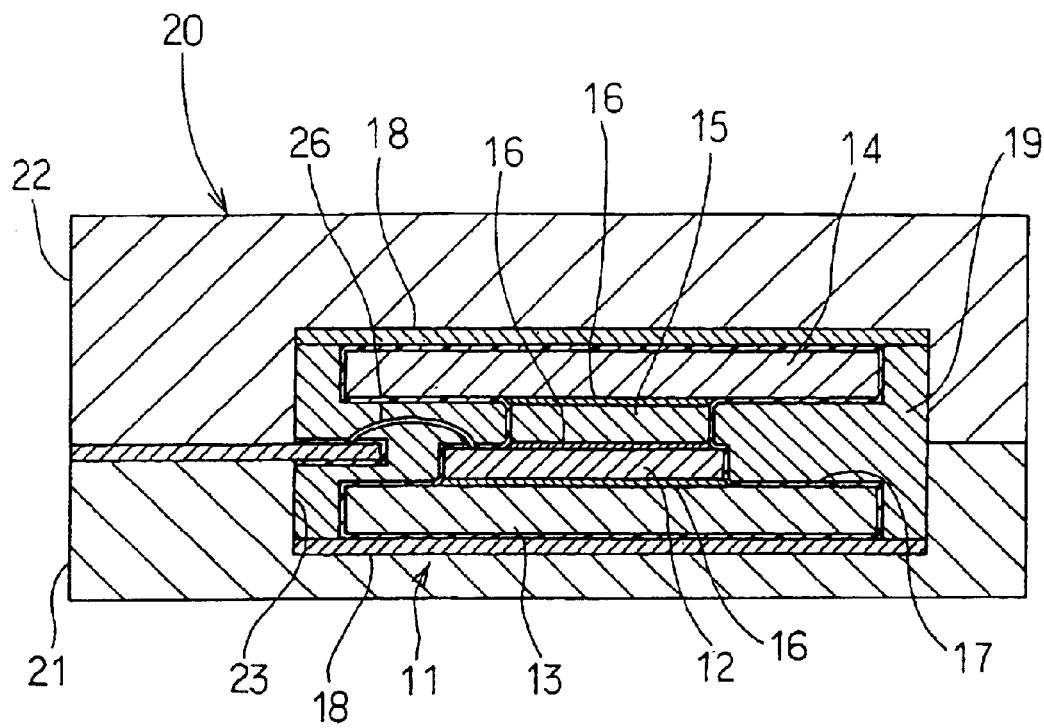
FIG. 1 is a cross-sectional view of a semiconductor device in a mold according to the present invention.

As shown in FIG. 1, a semiconductor device 11 includes a semiconductor chip 12, which generates heat, a lower heat sink 13 and an upper heat sink 14, which conduct the heat generated by the semiconductor chip, and a heat sink coupler 15. The lower surface of the chip 12 and the upper surface of the lower heat sink 13 are connected by solder 16, the upper surface of the chip 12 and the lower surface of the heat sink coupler 15 are soldered together, and the upper surface of the heat sink coupler 15 and the lower surface of the upper heat sink 14 are soldered together. The heat generated by the chip 12 is conducted through the heat sinks 13 and 14.

Figure 2A:
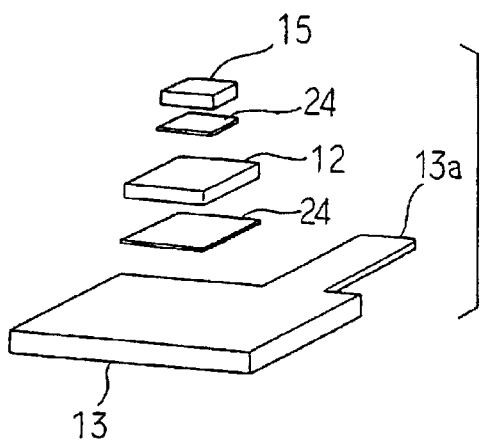
FIG. 2A is a diagrammatic exploded perspective view showing a process stage of a method for making the semiconductor device of FIG. 1.

In this embodiment, the semiconductor chip 12 is a power semiconductor such as an IGBT (Insulated Gate Bipolar Transistor) and a thyristor in the shape of a thin rectangular plate, as shown in FIG. 2A. The lower heat sink 13, the upper heat sink 14, and the heat sink coupler 15 are made of metal having high heat conductivity and electric conductivity, such as copper or aluminum. The lower heat sink 13 and the upper heat sink 14 are connected electrically to a pair of electrodes such as collector and emitter electrodes by the solder 16.

Figure 2D:
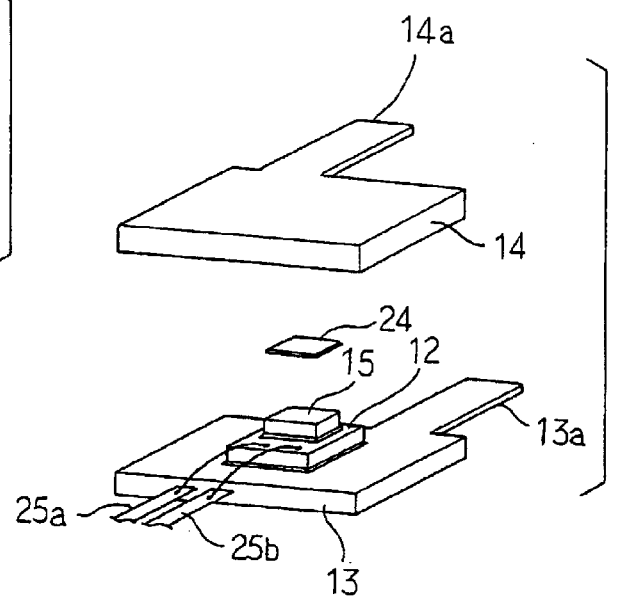
FIG. 2D is a diagrammatic exploded perspective view showing a process stage of a method for making the semiconductor device of FIG. 1.

The lower heat sink 13 is a rectangular plate and is integrated with a terminal 13a which is a rectangular plate extending rearward in FIG. 2A. The heat sink coupler 15 is a rectangular plate and is a little smaller in area than the semiconductor chip 12. The upper heat sink 14 is a rectangular plate and is integrated with another terminal 14a, which is a rectangular plate extending rearward in FIG. 2D. The terminals 13a, 14a do not face one another; that is, they are offset from one another as shown in FIG. 2D. The distance between the heat sinks 13, 14 is in the range between 1 and 2 mm.

As shown by a bold line in FIG. 1, a coating resin 17 made of polyamide resin is applied on the surfaces of the heat sinks 13, 14, the chip 12, and the heat sink coupler 15 to improve adhesion between a mold resin 19 and the heat sink members 13, 14. In this embodiment, the resin 17 is coated by immersion. Two insulating sheets 18, which are made of a material that deforms when compressed and is highly heat conductive, are adhered to the outer surface of the heat sinks 13, 14. The insulating sheets 18 are adhered using the resin 17 as adhesive, so no dedicated adhesive is needed.

The insulating sheets 18 used in this embodiment are made of silicon rubber and have the same thickness and the same surface characteristics. The heat conductivity of the sheets 18 is higher than that of the resin 19. However, the insulating sheets may differ in material, thickness, and surface characteristics from each other. For example, one of those insulating sheets 18 may be made of the same material as the other but may be thinner than the other to improve heat conduction or may have an uneven surface to improve damping efficiency. One of the sheets 18 may be made of a material having superior heat conductivity and inferior damping efficiency and the other may be made of a material having inferior heat conductivity and superior damping efficiency.

In general, the heat conducting sheets 18 are made of elastic polymer material that includes a heat conductive filler, and heat conductivity is improved at the expense of elasticity. Therefore, heat conductivity takes priority if one side of the chip is particularly hot. For example, the sheet 18 adhered to the lower heat sink 13 may be given greater conductivity than the upper sheet 18 if the lower heat sink corresponds to a collector electrode, which requires greater cooling.

As shown in FIG. 1, the mold resin 19, which is made of a material such as epoxy resin, fills the space between the insulating sheets 18 to surround the chip 12 and the heat sink coupler 15. A mold 20 is used to mold the resin 19 to a stack that includes the semiconductor chip 12, the heat sink coupler 15, the heat sinks 13, 14, and the insulating sheets 18. The mold 20 has a simple structure of a lower mold 21 and an upper mold 22, so the production cost of the semiconductor device 11 is relatively low. When the stack 8 is held in a cavity 23 of the mold 20, the insulating sheets 18 are pressed between the mold 20 and the heat sinks 13, 14 and compressively deformed by about 10 to 40%. Therefore, when the molten mold resin 19 is injected into the cavity 23, the resin 19 is prevented from covering the insulating sheets 18 on the surface pressed by the mold 20. In addition, the force applied to the chip 12 while the stack is pressed by the mold 20 is dampened and distributed by the sheets 18, so the chip 12 is not broken.

Figure 3:
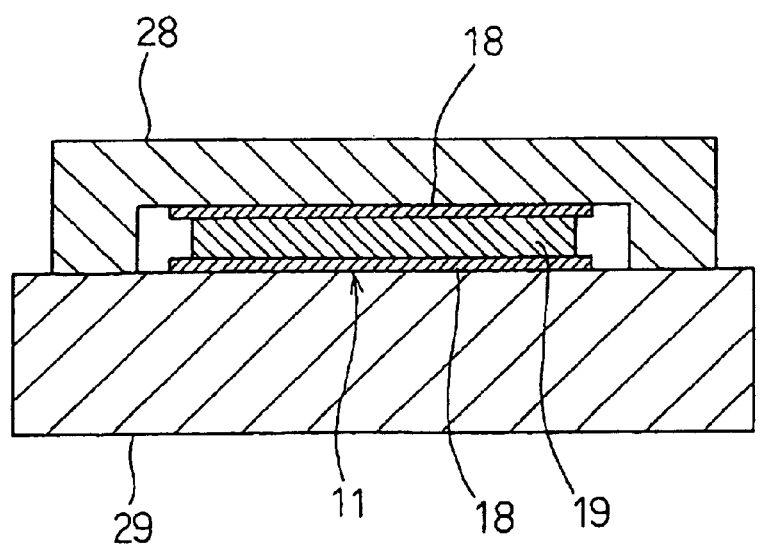
FIG. 3 is a cross-sectional view of a semiconductor device located between a pair of heat-transfer members.
Figure 5:
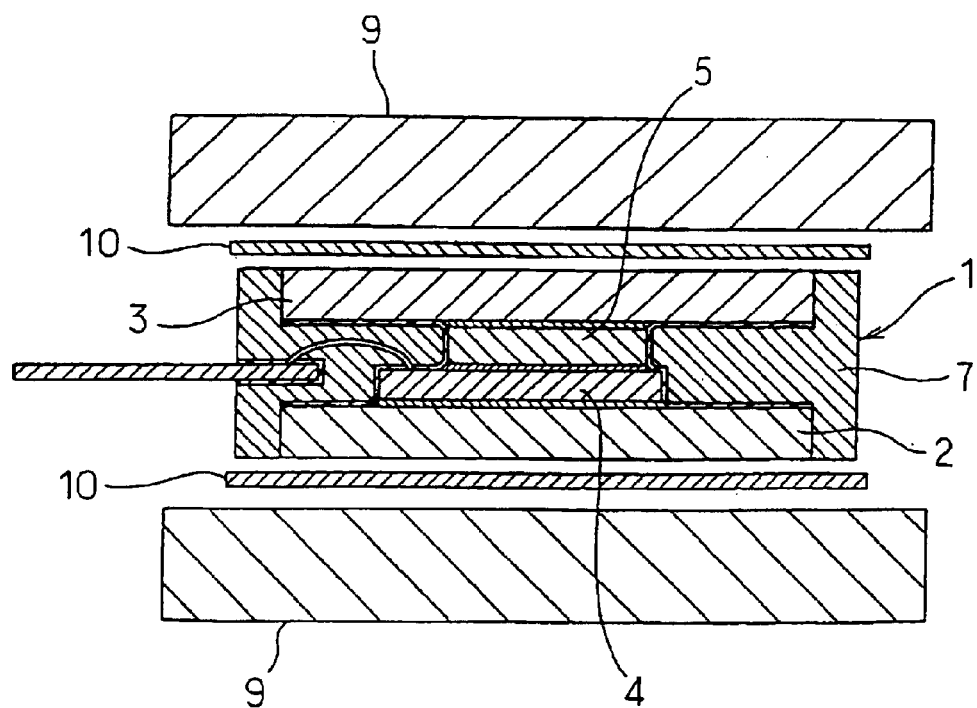
FIG. 5 is an exploded cross-sectional view of the proposed semiconductor device located between a pair of heat-transfer plates.

The outward surfaces of the heat sinks 13, 14 are insulated by the sheets 18. Thus, no dedicated heat conducting sheets made of insulating material (like the sheets 10 in FIG. 5) are needed when the completed device 11 is inspected, screened, assembled into a unit such as an inverter unit, or located between cooling plates 28, 29 as shown in FIG. 3.

The thickness of the semiconductor device 11, that is, the distance between the outer surfaces of the lower and the upper heat sinks 13 and 14, is nominally determined by the manufacturing method described later. However, the thickness varies due to deviation in various factors such as the size of each member and the flatness and inclination of the heat sinks 13, 14. Assuming that the deviation is 0.1 mm and the sheets 18 are compressively deformable by 15%, the minimum thickness of the sheets 18 is calculated by the following equation.

$$0.1 \text{ mm} \div 0.15 \div 2 = 0.33 \text{ mm}$$

Thus, the sheets 18 must have a thickness of at least 0.33 mm. The minimum thickness must to be adjusted in response to the thickness deviation of the semiconductor device 11 on a case-by-case basis.

Figure 2B:
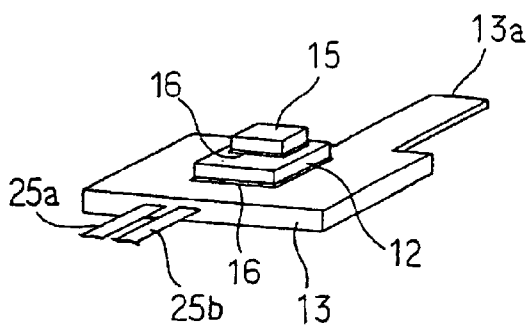
FIG. 2B is a diagrammatic perspective view showing a process stage of a method for making the semiconductor device of FIG. 1.
Figure 2E:
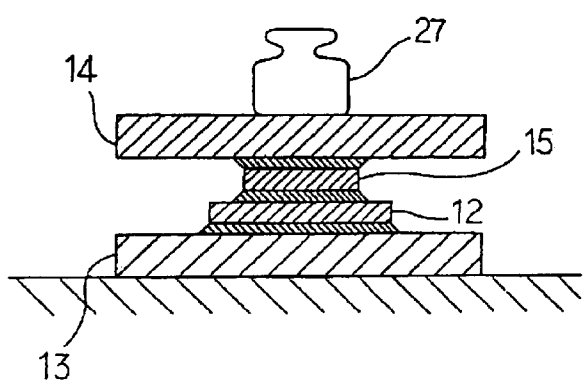
FIG. 2E is a diagrammatic cross sectional view showing a further process stage of a method for making the semiconductor device of the invention.
Figure 2C:
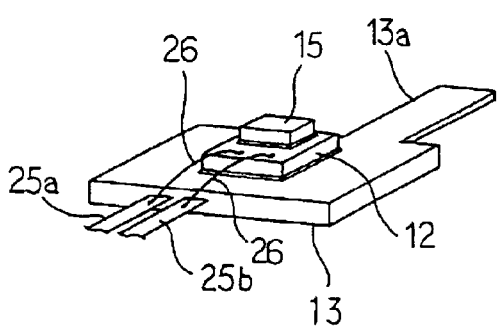
FIG. 2C is a diagrammatic perspective view showing a process stage of a method for making the semiconductor device of FIG. 1.
Figure 4:
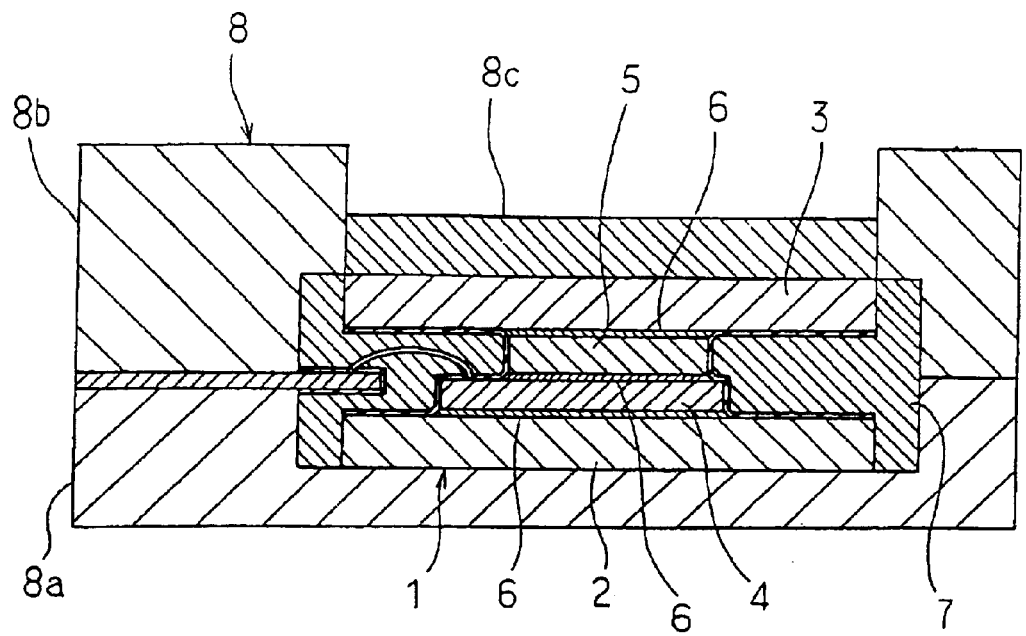
FIG. 4 is a cross-sectional view of a proposed semiconductor device.

The semiconductor device 11 is manufactured as shown in FIGS. 2A to 2E. First, the semiconductor chip 12, the heat sink coupler 15, and the lower heat sink 13 are soldered together. To be specific, the chip 12, the coupler 15, and a pair of solder foils 24 are stacked on the upper surface of the lower heat sink 13, as shown in FIGS. 2A and 2B. Then, the stack is heated by a solder-reflowing apparatus to fuse the solder foils 24. As shown in FIG. 2C, a pair of control electrodes of the chip 12, which may include a gate pad, are wire bonded to lead frames 25a and 25b using wires 26 made of metal such as aluminum or gold. Afterward, the upper heat sink 14 and the solder foil 24 are stacked on the coupler 15, as shown in FIG. 2D. The stack is heated by a solder-reflowing apparatus to fuse the solder foil 24. While the stack is heated, the stack is pressed by a weight 27, and a spacer (not illustrated) is located between the heat sinks 13, 14 to retain a predetermined distance between the heat sinks 13, 14, as shown in FIG. 2E.

Before the solder foils 24 are fused, the distance between the heat sinks 13 and 14 is greater than the predetermined distance. When the solder foils 24 are fused, the fused solder foils 24 become thinner, because the foils 24 are pressed by the weight 27, and the predetermined distance is retained by the spacer between the heat sinks 13 and 14. The fused foils 24 mechanically and electrically connect the heat sink 13 and the chip 12, the chip 12 and the coupler 15, and the coupler 15 and the heat sink 14. In this embodiment, the solder foils 24 are used. However, instead of the foils 24, solder paste or conductive adhesive may also be used.

Subsequently, the coating resin 17, which is made of polyamide resin, is homogeneously coated on the surfaces of the heat sinks 13, 14, the chip 12, and the heat sink coupler 15 by immersing the soldered stack in polyamide resin solution. In this immersion, the coating resin 17 is also applied to the surfaces of the wires 26 and the lead frames 25a, 25b. Instead of the immersion, the coating may be done by dripping or spraying the resin 17. In that case, it is preferred to insert a nozzle dispensing the resin 17 into the space between the heat sinks 13, 14 and drip or spray the resin 17 from the tip of the nozzle.

In this embodiment, the insulating sheets 18 are adhered to the heat sinks 13, 14 before the resin 17 dries, so no dedicated adhesive is needed. That is, the resin 17 doubles as adhesive. However, the sheet 18 may be adhered using an adhesive that has good heat conductivity after the resin 17 is thoroughly dried.

As shown in FIG. 1, the stack, which is coated with the resin 17, is put in the cavity 23 of the mold 20, which has the lower mold 21 and the upper mold 22, and is partially covered with the mold resin 19. The molten mold resin 19 is injected into the cavity 23 fill the space between the insulating sheets 18 and to surround chip 12, the heat sink coupler 15, and the heat sinks 13, 14, shown in FIG. 1. After the resin 19 is set, the completed device is ejected from the mold 20.

What is claimed is:

1. A semiconductor device comprising:

a semiconductor chip, which produces heat when operated;

a heat conducting plate for conducting heat provided on one side of the semiconductor chip;

an insulating sheet, which is a dielectric and is compressively deformable, also provided on the one side of the semiconductor chip, wherein the heat conducting plate is positioned between the semiconductor chip and the insulating sheet, and the insulating sheet is secured to the heat conducting plate; and a resin molding covering the semiconductor chip, the plate, and the sheet such that the sheet is exposed from the resin molding.

2. The semiconductor device of claim 1, wherein the heat conductivity of the insulating sheet is greater than that of the resin molding.

3. The semiconductor device of claim 2, wherein the insulating sheet is made of silicone rubber.

4. The semiconductor device of claim 1, wherein the insulating sheet is adhered to the heat conducting plate using a coating resin applied to the heat conducting plate.

5. The semiconductor device of claim 4, wherein the coating resin is polyamide resin.

6. The semiconductor device of claim 1, wherein the semiconductor chip forms part of a stack, and the stack includes the plate, and opposite sides of the semiconductor chip are soldered to members of the stack.

7. The semiconductor device of claim 1, wherein the insulating sheet is made of a dielectric resin material.

* * * * *